US010794939B2

(12) United States Patent
Gavrilov et al.

(10) Patent No.: US 10,794,939 B2
(45) Date of Patent: Oct. 6, 2020

(54) SENSORS FOR POWER DISTRIBUTION NETWORK AND ELECTRICAL GRID MONITORING SYSTEM ASSOCIATED THEREWITH

(71) Applicant: The Research Foundation for the State University of New York, Albany, NY (US)

(72) Inventors: Dmitri Gavrilov, Setauket, NY (US); Mikhail Gouzman, Centereach, NY (US); Serge Luryi, East Setauket, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 303 days.

(21) Appl. No.: 15/718,260

(22) Filed: Sep. 28, 2017

(65) Prior Publication Data
US 2018/0017602 A1    Jan. 18, 2018

Related U.S. Application Data

(63) Continuation-in-part of application No. 14/283,476, filed on May 21, 2014, now Pat. No. 9,778,286.
(Continued)

(51) Int. Cl.
*G01R 19/25*  (2006.01)
*G01R 31/42*  (2006.01)
(Continued)

(52) U.S. Cl.
CPC ......... *G01R 19/2513* (2013.01); *G01R 15/14* (2013.01); *G01R 19/2516* (2013.01);
(Continued)

(58) Field of Classification Search
CPC ......... G05F 1/70; H02J 3/00; H02J 2003/007; G01R 19/2513; G01R 21/133;
(Continued)

(56) References Cited

U.S. PATENT DOCUMENTS

| 6,714,000 B2* | 3/2004 | Staats | G01R 15/142 |
| | | | 324/107 |
| 2003/0038709 A1* | 2/2003 | Kim | H04B 3/54 |
| | | | 370/431 |

(Continued)

OTHER PUBLICATIONS

An Office Acton issued in the U.S. Appl. No. 14/283,476, filed May 21, 2014.

*Primary Examiner* — James J Lee
*Assistant Examiner* — Shon G Foley
(74) *Attorney, Agent, or Firm* — Lawrence G. Fridman, Esq; Feigin & Fridman, LLC

(57) ABSTRACT

A system of sensors associated with a branched conductor of an AC power line using the conductor as the communication medium between different sensors. The communication is carried out at frequencies higher than the powerline frequency. At least one sensor is provided in every branch in the vicinity of every branching point of the conductor. Synchronous measurements are carried out of the root mean square current passing through every branch of the conductor and the direction of energy flow in the branch. Results of the measurements are regularly reported throughout the system. An arrangement is provided for analyzing the results of the measurements to determine the graph topology of the branched conductor and ascertain the distribution of the root mean square current passing through every branch of the graph.

20 Claims, 11 Drawing Sheets

Related U.S. Application Data

(60) Provisional application No. 61/825,592, filed on May 21, 2013.

(51) Int. Cl.
*G01R 15/14* (2006.01)
*H02J 3/00* (2006.01)
*G05F 1/70* (2006.01)

(52) U.S. Cl.
CPC ............... *G01R 31/42* (2013.01); *G05F 1/70* (2013.01); *H02J 3/00* (2013.01)

(58) Field of Classification Search
CPC ... G01R 15/181; G01R 31/086; Y02E 60/728; Y04S 10/265; Y04S 10/30; G06Q 50/06
See application file for complete search history.

(56) References Cited

U.S. PATENT DOCUMENTS

| | | | |
|---|---|---|---|
| 2007/0099628 A1* | 5/2007 | Twitchell, Jr. | G01C 21/206 455/456.1 |
| 2008/0109387 A1* | 5/2008 | Deaver | G01R 19/16547 705/412 |
| 2013/0218495 A1* | 8/2013 | Boone | G01D 4/002 702/62 |
| 2014/0164377 A1* | 6/2014 | Kanabar | H04Q 9/00 707/737 |

* cited by examiner

Table. Example of data obtained from the sensors from the network shown in Fig.11.

| Sensor | Current (Magnitude) | Current (Phase) | Geographical Coordinates (X,Y) |
|---|---|---|---|
| 150 (root) | 43.2064 | 4.8275° | (1, 10) |
| 152 | 28.9963 | 177.0461° | (2, 12) |
| 154 | 15 | -160° | (2, 8) |
| 156 (load) | 15 | 20° | (3, 6) |
| 158 | 28.9963 | 177.0461° | (3, 14) |
| 160 | 28.9963 | -2.9539° | (5, 14) |
| 162 | 17 | -170° | (6, 16) |
| 164 | 13 | 160° | (6, 12) |
| 166 (load) | 17 | 10° | (7, 17) |
| 168 (load) | 13 | -20° | (7, 10) |

FIG. 12

SENSORS FOR POWER DISTRIBUTION NETWORK AND ELECTRICAL GRID MONITORING SYSTEM ASSOCIATED THEREWITH

REFERENCE TO RELATED APPLICATION

This Application is a continuation-in-part application of currently pending U.S. patent application Ser. No. 14/283,476, filed May 21, 2014 which claims priority of U.S. Provisional application Ser. No. 61/825,592 filed by the inventors on May 21, 2013, the entire disclosure of the above-noted application is hereby incorporated in their entirety by reference.

FIELD OF THE INVENTION

The present invention relates to characterization and monitoring of the state of a power distribution network.

BACKGROUND OF THE INVENTION

Power distribution networks are distributed over vast geographical areas and have sophisticated multilayered architecture. While the exact structure of the upper levels is well known, the exact structure of the lower level of a power distribution network, responsible for delivery of power to individual consumers, often poorly documented and sometimes unknown. The lack of information about the architecture of the low-level structure of the network present challenges in the development of systems for monitoring of power delivery to consumers. One of the necessary features of such monitoring system is automated generation of network map, that shows the location of the branching points of the network and precise connections between those branching points. Such map will show precise path of power delivery to each consumer and allow to perform a variety of diagnostic and troubleshooting procedures. Precise knowledge of the network configuration facilitates the development of procedures for identification of possible locations of energy loss or theft from periodically obtained readings of energy flow at various branches of the network.

Since power distribution networks are generally large scale multilayered systems, the direct data collection and analysis from entire network is intractable task. Data collection and processing system, organized in multiple layers, naturally follows from architecture of the network. While the upper layers of the network are structurally simple, well managed, and monitored using well established routines and expensive equipment, the lowest levels, representing power delivery to residential areas, are hardly monitored at all. Automated monitoring of residential power distribution network requires data collection from substantial number of geographically distributed points. For such monitoring system to be cost effective, it must employ inexpensive and easy to install self-powered sensors, capable of organizing in ad hoc network and communicating via low-cost or free communication channel.

The system of sensors of the inventions relates to monitoring of the electrical power distribution networks. The recent progress in smart grid technology causes the development of methods for intelligent control for power distribution networks. Successful implementation of such methods requires continuous collection of consistent data about low-level operation of the network. The electrical power distribution networks are spread over vast geographical areas, and implementation of a system for collection of detailed real-time data on operation of the network faces the following significant challenges.

Power distribution network consists of a substantial number of components that needs to be monitored. The solution requires a substantial number of sensors to be installed. Large size of a typical power distribution network leads to large amount of data that needs to be collected from the sensors and processed by a CPU. The solution requires employing network clusterization and use of inexpensive communication channels.

One of the shortcomings of the contemporary power grid distribution systems, is that the systems do not know their own state. This is painfully felt during periods of massive failure caused by the fury of the elements or by a technical failure of a major component. Making power distribution networks robust and rapidly recoverable after natural disasters is perhaps the most urgent task in the on-going improvement of the national infrastructure. The importance of this task is generally understood. Its key elements include implementing modern monitor and control systems for power networks. These two systems must work coherently (with due regard for each other) with the monitor system setting the appropriate environment for the control system.

What is there to monitor, is an essential question. Each power distribution network can be described by a Graph represented by nodes of specified nature, their specified geographical position on a 2D map, and the topology of connecting lines. The state of the network is further characterized by the energy flow over the Graph.

Disruptions of the energy flow are associated with the breakdown of electrical connectivity of the power network and the required information that fully characterizes the network is therefore topological in nature. This is not, however, the shape in which the information about network failures reaches the control room of the contemporary utility. Instead of the desired automatic description of energy-flow disruptions, one deals with haphazard telephone reports of "no light in our house". The price we pay is in delayed and low-efficiency repair activity.

Alternative approaches to automatic monitoring state of the power grid are as follows. A simple system could be based on "on-off" reports of local access to power, an automated sensor-based version of the customer telephone call. Even when such reports are fully collected and accurate, they provide no information needed for a topological analysis of the possibly impaired connectivity of the grid.

On the other hand, sophisticated systems may be based on phasor measurement units (PMU). The PMU are sometimes called the synchrophasors, as they measure the instantaneous values of both the voltage and the current synchronously over the network. A PMU network can be compared to a multi-channel digital oscilloscope with synchronized channels in different locations. This is an expensive proposition and to-date PMU installation has been limited to critical substations of a power grid. The use of PMU data presumes the preliminary knowledge of the network topology, which is justified only if the network is restricted to the backbone of principal intersecting locations.

The electrical grid monitor system (EGMS) discussed in the application is based on the modern sensor, communication and computational technologies. The EGMS will not tamper with the power networks themselves and it can be applied both to the existing grids and the future smart grids. The sensors to be used must be inexpensive and safe. The latter requirement precludes direct electrical contact with "hot" wires, so that the smart measurements should be based on sensing the magnetic field.

The approach of the invention to the EGMS aims at collecting the minimum data necessary to reconstruct the topological organization of the network. This makes the system inexpensive both in hardware and installation. The essential aspects of the invention that lead to this cost reduction are (i) abandoning instantaneous flow of data in favor of the average and (ii) eliminating all galvanic measurements, i.e. direct contact of sensors with the "hot" wire. Therefore, the EGMS can be contemplated to assume an utmost penetration of the power grid, down to single household units. The cost of individual sensors associated with the invention is substantially reduced. Such sensors can be installed and maintained by the relatively low level electric utility personnel, causing further cost reduction of installation and maintenance of the electrical grid monitor system of the invention.

SUMMARY OF THE INVENTION

The invention addresses the problem of monitoring of the power distribution networks by dividing the network into multitude of clusters, deploying a distributed network of sensors in each cluster and enabling communication between sensors in each cluster and data collection and processing unit. The sensors within the same cluster are sharing the same powerline conductor, which they use as a communication medium. This makes possible self-identification of all sensors belonging to the same cluster. The invention provides am arrangement for automated identification of topology and generation of a map of individual clusters. The map of power distribution network may be generated by combining the maps of each cluster of the network.

Another essential aspect of the invention also discloses the method for monitoring of the electrical network, using distributed network of sensors, strategically placed on the conductors of the power line around the branching points and synchronously measuring RMS values of currents in the conductors and the direction of the Poynting vector. Applying Kirchhoff Current Law to the globally collected data set and using GPS coordinates of sensors, the map of the power distribution network could be generated. The future data from the sensors in conjunction with the generated map is used for monitoring operation of the network and detection of possible malfunctions.

The invention improves the method by providing an arrangement that facilitates monitoring of large-scale power distribution systems. The monitoring sensor network for such system will produce prohibitively large amounts of data, that are impossible to collect and analyze without systematic approach. The invention also discloses the method for separating the sensor network into clusters, collection and processing of data and generation of map separately for each cluster, and joining the cluster maps to obtain the map of the large-scale power distribution system. This aspect of the invention also provides a method for collecting data from sensors that belong to the same cluster, by assigning sensors installed on the same powerline conductor to the same cluster and utilizing the common conductor for communication between sensors. The improved method for identification of the power distribution system topology is utilizing information about sensor connectivity within the cluster and GPS coordinates for generation of more accurate network maps.

The invention provides a method for monitoring of the electrical power distribution grid and its implementation. The method employs a network of sensors, installed on conductors of the power lines. The sensors are collecting data relevant to operation of the network and sending the data for outside processing. The collected data allows to identify the topology of the power distribution grid, generate the map of the grid, monitor changes in connections between the elements of the grid, and monitor the real-time grid operation.

The data, collected by each sensor, includes RMS current in the conductor, instant phase of current, instant phase of voltage, the direction of energy flow (Poynting vector) and GPS coordinates of the sensor. The sensors are grouped in clusters: the sensors installed on the same conductor are assigned to the same cluster. Assignment to clusters is performed automatically, as sensors communicate data via powerline to the communication units, installed on each conductor of the network. All conductors of the grid are separated by transformers, which are not transparent to higher frequency communication signals. The sensors, communicating with one communication unit, are assigned to the same cluster as the communication unit. The estimation of grid topology and generation of the grid map starts with generation of maps of branches, formed by individual conductors of the grid. Each conductor is represented by one cluster of sensors. The map of the branch is generated by analyzing connectivity between sensors and synchronously measured RMS values and phases of currents, reported by the sensors. The map of the grid is created by combining the maps of branches. Monitoring of the network integrity and changes in topology is performed in real time by constant verification of the network model, created on the stage of the grid map generation. The same model is used for monitoring of loads in the network, and identification of suspicious activity, such as electricity theft.

Another aspect of the invention provides the electrical grid monitor system (EGMS) based on modem sensor, communication and computational technologies. The system does not require restructuring of the contemporary power distribution networks and can be applied both to the existing grids and the future "smart grids". The approach of the invention is based on a mathematical description of the connectivity aspects of the power grid. When projected onto a geographical map, the topological information provides the desirable account of the state of the network.

Each power distribution network is described by a Graph represented by Nodes of specified nature (such as generators, transformers, loads, switches, and storage units), their specified geographical position on a 2D map, and the topology of connecting lines. The state of the network is further characterized by the energy flow over the Graph. The energy flow is impractical to measure as it requires expensive sensors and sophisticated installation. According to the invention the state of the network can be adequately characterized by specifying the Root Mean Square (RMS) currents and the direction of energy flow in all connecting lines.

The instantaneous RMS currents are impractical to record, as they fluctuate on a short time scale; therefore, averaging is required. It is essential that the averaging is carried out synchronously over the entire Graph over a specified time interval. For the system of sensors clusterized as in the present invention, the synchronization requirement may be relaxed in that synchronous averaging can be performed over individual clusters separately.

The purpose of the electrical grid monitor system (EGMS) of the invention is to create and continuously update both the Graph and the State of a power network. The system is based on a network of sensors, installed on every connecting line and communicating measured data to a central processing unit (CPU). The reported data empower the CPU to reconstruct the power distribution network.

The grid connectivity is embodied in Kirchhoff's current law that should be valid at every node of the network and should not be violated by averaging. Averaging is expected to be done locally at each sensor with global synchronization aided by the GPS. The minimum data from each sensor should include the direction of energy flow relative to the nearest node, the RMS current averaged over a chosen averaging period and the geographical position of the sensor.

BRIEF DESCRIPTION OF THE DRAWINGS

FIG. 12 is the table containing an example of data, collected from the sensors of the network shown in FIG. 11.

DETAILED DESCRIPTION OF THE INVENTION

A typical power distribution network comprises a multiplicity of Nodes (N) connected by Connecting Lines (CL). A connecting line comprises at least two or a multiplicity of conducting wires, referred to as phase wires. Each connecting line has two associated Nodes at opposite ends thereof. The connecting line phase wires are not equivalent, e.g., for a single phase connecting line one of its two wires is the hot wire, and the other is neutral or ground wire. These phase wires must be appropriately matched with the respective Node.

Nodes can be of various types including, but not limited to Power Sources (PS), Loads (L), and Power Converters (PC), e.g. transformers and switches. The type of node is reflected in the direction of energy flow. Each node has at least two or a plurality of ports associated with the connecting lines connected to it. A power source node is characterized by the outward direction of the energy flow in the associated connecting line. The load node is characterized by the inward direction of the energy flow in the associated connecting line. The power converter node typically has at least one inward and one outward connecting line. There can be also bi-directional nodes, such as rechargeable batteries.

Each power distribution network is fully described by a Graph represented by Nodes of specified nature and specified geographical position on a 2D map, and the topology of connecting lines. The state of the network is further characterized by the energy flow over the Graph. The energy flow depends on time. The instantaneous value of the energy flow is impractical to record, as it fluctuates substantially. It is preferred to specify the time interval over which the energy flow is averaged. It is also preferred that the averaging is carried out synchronously over the graph.

Figure 1A:
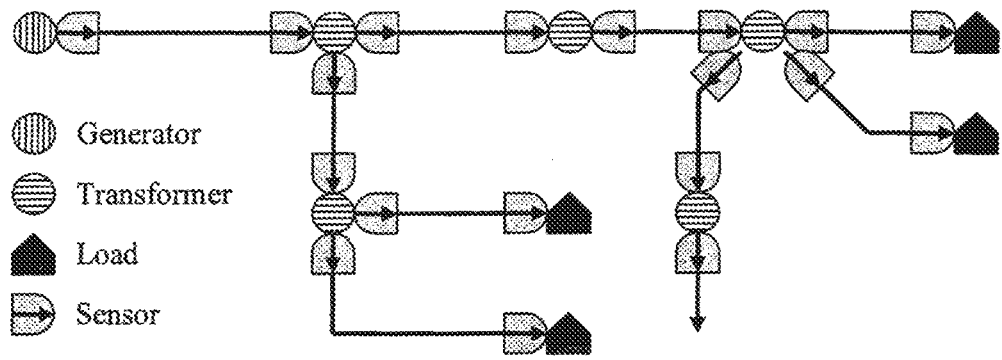
FIG. 1A is a diagram illustrating a power grid and a sensor mesh network.
Figure 1B:
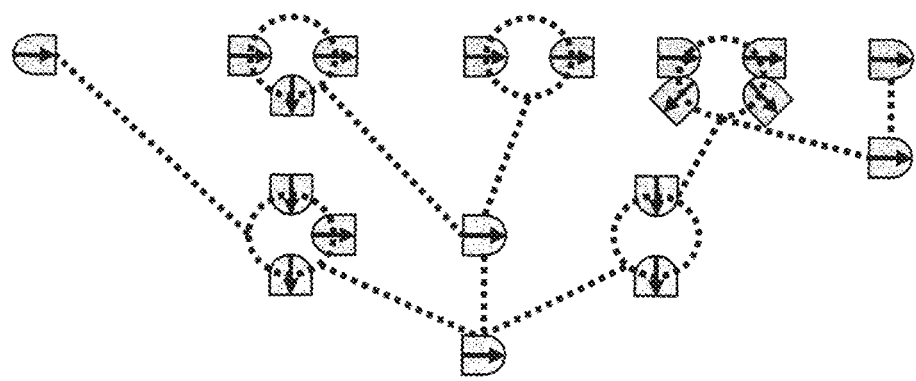
FIG. 1B is a diagram illustrating established communication links shown by dotted lines.

Various topologies of the communication network and the power grid itself are illustrated in FIGS. 1A and 1B. FIG. 1 A shows power grid and sensor mesh network. FIG. 1B reflects established communication links which are shown by the dotted lines.

According to the invention, a network of sensors is associated with the power network. One of the main functions of the sensors is to measure and report the physical quantities that enable a Central Processing Unit (CPU) to create and update both the Graph and the State of the Power network. The sensor network may be of different topology than the Graph of the power network itself, as illustrated in FIGS. 1A and 1B. Specification of the nature and properties of the required sensors, as well as their positioning within the Power network, constitute an important aspect of the present invention. Topology of the sensor network is determined by the need for efficient communication between individual sensors and the CPU.

The Central Processing Unit is a computer that communicates with sensors via the sensor communication network and is capable of creating and updating the Graph and the State of the Power network. This occurs on the basis of data received from all individual sensors. This is an important task of the central processing unit. Additional tasks may be also advantageously carried out by the central processing unit, e.g., prediction of the future state of the network.

The reported information about the distribution of the Root Mean Square (RMS) currents and the directions of energy flow enables the central processing unit to reconstruct the power network both as the graph and the state of the graph. To accomplish this, the CPU will begin from any high-level node, e.g. from the main generator, and reconstruct the graph by branching from node to node with the help of Kirchhoff's law. In this way, a topological description is obtained. It is known how nodes are connected but not where they are positioned. Geographical placement of sensors is accomplished by using satellite based systems, such as for example Global Positioning System (GPS).

A predetermined sensor should measure several physical quantities, such as the value of Root Mean Square (RMS) current, synchronously with other sensors of the network. Measurement of other quantities, such as direction of the energy flow, does not require precise synchronization. The preferred way of synchronization is to use available satellite based systems, such as Global Positioning System (GPS) or Global Navigation Satellite System (GLONASS). Alternatively, one may use radio-broadcast time synchronization systems.

As to one aspect of the invention Kirchhoff's law is utilized as a tool for network topology reconstruction. Full description of a power grid in operation (State of the Graph) could be provided by the complete diagram of the energy flow. To build such a diagram one needs the knowledge of the Poynting vectors, $S=E \times H$, in every conducting line. However, a monitoring system based on the direct measurement of the Poynting vectors can be impractical and costly.

Precise determination of the electric field vector E requires measurement of the potential on the high-voltage wire relative to ground. One can avoid direct galvanic connection to AC wire by using cylindrical capacitive probes. However, to avoid uncontrollable phase shift, the impedance of a voltmeter arranged between these probes would have to be much larger than their impedance, i.e. at least as high as 1 GΩ—due to the unavoidably low capacitance of the probes. Such a voltmeter would be costly and impractical for the purposes of the invention Moreover, a description based entirely on the energy flow would not fully reflect the connectivity of the network. This is because the flow of electromagnetic energy over the network does not obey a continuity equation because of dissipation.

The continuity equation that works over the power network reflects the conservation of charge and is embodied in the Kirchhoff law (for current). This suggests Kirchhoff's law as a useful tool for topology reconstruction. Measurement of the current magnitude in a wire is simple and non-galvanic. In practice, it reduces to measuring the magnetic field at a distance from the wire. Consistent application of Kirchhoff's law needs an additional ingredient, such as the current direction. As to this ingredient, it should be noted that the AC current has no direction. When the current is characterized it by a Root Mean Square (RMS) value, "the arrow" can be pointed either way. The issue can be resolved by a simple convention to point the arrow in the direction of the energy flow. This information is encoded in the orientation of the Poynting vector.

Figure 2:
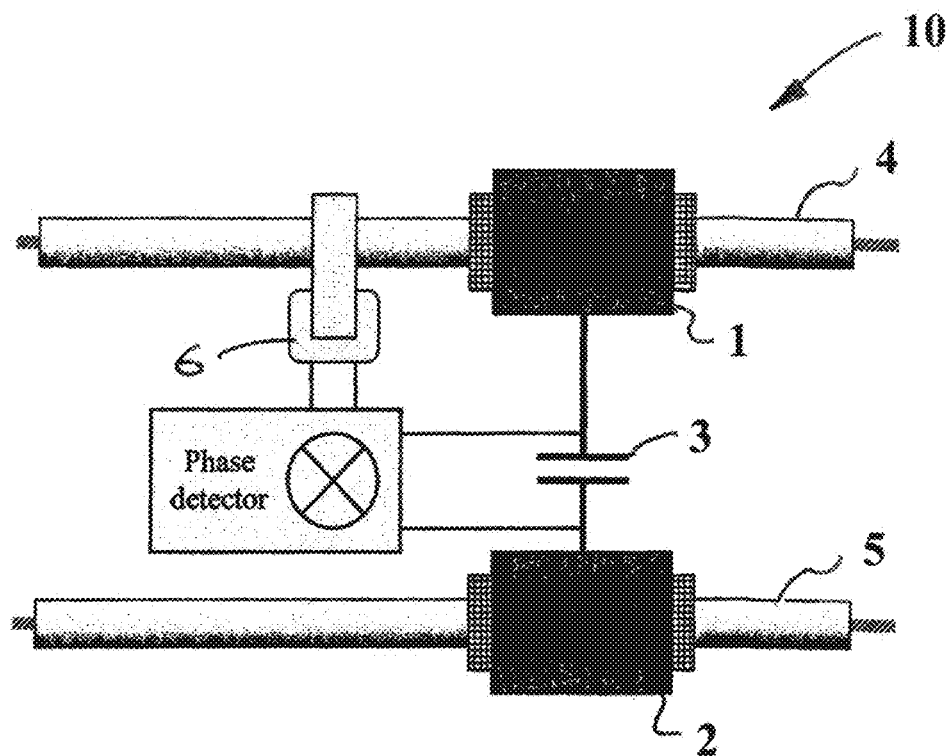
FIG. 2 is a diagram illustrating a non-galvanic measurement of the direction of energy flow in AC wire.

Measurement of the orientation (and not magnitude) of the Poynting vector is a simpler task that can be accomplished without galvanic connections. All that is needed is the phase between AC current and AC voltage, without need for the knowledge of their magnitudes. Referring now to FIG. 2, which illustrates non-galvanic measurement of the direction of energy flow in AC wire. The relative phases of voltage and current are determined accurately by the capacitive voltage divider 10 ($C_{p1}$-$C_m$-$C_{p2}$) and the current sensor 6, e.g. a current transformer. The capacitive divider 10 adds no phase-shift to the measurement. The capacitive divider 10 comprises two insulated cylindrical probes of capacitance 1 and 2 ($C_{p1}$) and ($C_{p2}$) associated with insulated wires 4 and 5 respectively, in series with a measuring capacitor 3($C_m$). The magnitude of the voltage drop on $C_m$ is rather uncertain because the capacitance of the cylindrical probes is poorly controlled but the phase of this voltage drop is monitored accurately. Knowledge of the Poynting vector orientation in each conducting line will ensure consistent application of Kirchhoff's law.

Figure 3:
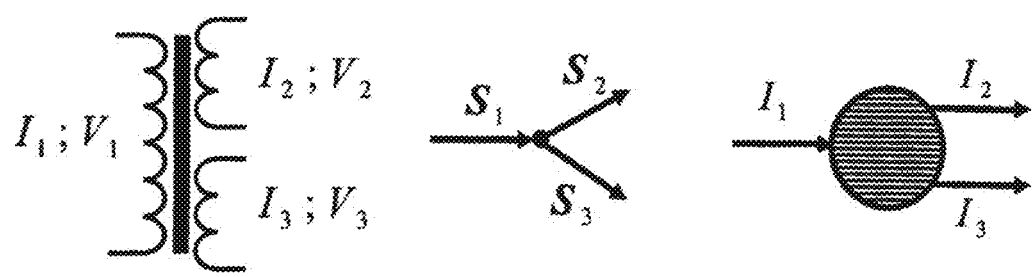
FIG. 3 is a diagram illustrating application of generalized Kirchhoff's law for a transformer node.

As to another aspect of the invention Kirchhoff's law is also utilized for transformer nodes. A power transformer comprises a plurality of primary and secondary coils carrying AC currents that interact magnetically. Each coil is an element of a circuit where Kirchhoff's law is in full obeisance. The law, however, fails to describe the relation between currents in different coils of the transformer itself, which is an extended object, not a simple point node. There are two reasons for this failure: the transformation coefficient $k_{ij} \equiv V_j/V_i \neq 1$ between the voltages on any pair of primary and secondary coils and the power loss $\eta < 1$ in the ferromagnetic core. Parameters $k_{ij}$ and $\eta$ are characteristics of any transformer, assumed known to the Central Processing Unit (CPU). Knowledge of these parameters enables us to extend Kirchhoff's law to the case of a transformer by a simple generalization, $$\eta I_1 = k_{12} I_2 + k_{13} I_3, \quad (1)$$

where I denote the currents flowing in and out of the transformer node, cf. FIG. 3. With this generalization, Kirchhoff's law assumes a universal validity over the entire network. Each graph thus reduces to a set of homogeneous equations for $\{I_j\}$ that any legitimate state of the graph must obey.

Generalized Kirchhoff's law (1) for a transformer node (see FIG. 3) allows one to represent the latter as a point node. In this representation, currents $I_1$, $I_2$, and $I_3$ are the RMS values of the AC currents flowing in the hot wire of the transformer coils, related by Eq. (1). By convention, the ground wire is ignored and chosen is the orientation of the hot-wire current $I_j$ as that of the corresponding Poynting vector $S_j$.

The above approach enables one to fully describe the simplest state of the power network that corresponds to a stationary power distribution. If the state remained stationary, the RMS values could be measured asynchronously in various parts of the network.

The non-stationary situation is often more relevant. As loads vary, the RMS currents themselves become functions of time, $I_j = I_j(t)$. These functions can be averaged over any period $\tau$ shorter than the characteristic times $T_j$ of their variations without losing significant information, provided this averaging does not violate Kirchhoff's law. For a single node, this will be ensured if the averaging is done over the same time interval for all connecting lines associated with it. This will remain true for the entire network, provided the averaging is done synchronously over all nodes. In the process of averaging, "instantaneous" RMS currents $I_j(t)$ are replaced by the integrals, $$\bar{I}_j(t) = \int_t^{t+\tau} I_j(t')dt'. \quad (2)$$

The averaging period $\tau$ is a design choice that can be optimized depending on the network conditions. The choice is a trade-off between the resolution of individual disruptive events (optimized by the shorter $\tau$) and the economy in the information transmitted over communication channels. In any case, we expect $\tau$ to be much longer than the AC oscillation period of 16 mS.

Averaging periods are the time intervals selected synchronously over the graph to averaging the energy flows. The averaging periods must be long compared to the characteristic time of the fluctuations in the energy flows associated with random load variations. The average energy flow in a particular connecting line is analogous to the coordinate of a Brownian particle continuously bombarded by molecules from all sides. It is that coordinate that we are interested to follow in time by averaging over many molecular impacts. The averaging period must therefore be short compared to the time of coordinate variation of the Brownian particle, i.e., of the variations in local energy flows.

The invention aims at making the system inexpensive and safe, and requires self-organization of each sensor. In the maintaining the system of the invention the installer needs not program the sensor as to where it is installed. Each sensor learns its x-y position from the GPS and uses this information for self-identification in the mesh network. The current GPS receivers provide an accuracy of order 1 m horizontally, which should be sufficient to distinguish sensors belonging to different nodes. Sensors belonging to the same node (on different connecting lines) will be identified as such. All sensors should be installed oriented in the same way relative to the nearest node, which will enable the identification of upstream or downstream power lines via measured orientation of the Poynting vector.

In addition to two-dimensional, x-y position, used for self-identification of sensors, the GPS provides three-dimensional, altitude information with respect to an additional z coordinate. This information can be used for fast identification of falling poles. This information is obtained free of additional charge and will become more and more useful with increasing accuracy of the GPS.

The minimum data required to be collected by the sensors and reported to the central processing unit is determined by the requirement that the CPU is capable of reconstructing from these data both the Graph and the State of the network. At the minimum, the reported data include the geographical position of each sensor, the direction of the energy flow and the value of Root Mean Square (RMS) current through each sensor, synchronously measured over the entire network and averaged over chosen averaging period. In a preferred embodiment, the reported data may be restricted only to changes in the measured parameters rather than parameters themselves. This may be used whenever communication bandwidth is limited. Depending on the type of the sensor used, the required information may include the sensor orientation relative to the gravitational and magnetic fields at the sensor location. Furthermore, the additional collected data may include the temperature and humidity at the sensor location, as well as other environmental information.

For the purposes of the invention, the global positioning system (GPS) provides two cornerstone signals used in the functioning of the EGMS, one pinpointing space, the other time which synchronizes the averaging process over the entire grid. Synchronization delegates the task of averaging, i.e. performing the integration (Eq. 2), to individual sensors, thus significantly lowering the communication budget.

The required accuracy of synchronization is not taxing at all. The required is mainly specification of the initial moment with a resolution better than half-period of AC oscillation (8 mS). This task would not be easy to accomplish through the sensor network itself because of the unpredictable delays associated with its contemplated mesh nature. The GPS provides a synchronizing signal theoretically accurate to about 10 nanoseconds. However, most receivers lose accuracy in the interpretation of the signals and are only accurate to 100 nanoseconds. Either way (by 6 or 5 orders of magnitude), this precision far exceeds the required accuracy.

A convenient way of averaging the RMS signal is to integrate over exact number of periods, $N=2\pi f\tau$ with integer N. This reduces the integration error and suppresses the noise associated with asynchronous interference. An appropriate circuit for this task involves a zero-crossing detector, a programmable counter and an integrator.

To reduce the amount of information to be communicated to the central processing unit, each sensor carries out local data processing and storage. One of the essential data processing functions is averaging the Root Main Square (RMS) current over the averaging period selected for the entire network. In some cases, the local values of RMS voltage are known. In this case the processing functions may include evaluation of the energy flow through the sensor, based on the calculated average values of RMS current, and the directions of the energy flow.

The sensors of the invention are able to operate in two modes, normal and emergency. The emergency mode is distinguished by the absence of power in the connecting line. In the normal operation mode, the sensors are powered by power network itself, preferably through a current transformer. In the emergency operating mode, this power is not available and the sensor must draw energy for its operation from an alternative power source. In the preferred embodiment, the alternative power source is a rechargeable battery or super-capacitor that is charged during the normal operation. Other alternative power sources may include many conventional power sources including but not limited to solar batteries or windmill generators. The amount of power required in the emergency mode should be minimized by curtailing many of the normal operating functions. At the minimum, in the emergency operating mode, the sensor acts as a beacon reporting the absence of power in the connecting line.

The communication functionality is essentially different in the two operating modes. In the normal mode, the preferred mode of communication is bi-directional. In this mode, each sensor can perform both send and receive functions. In this case, the preferred communication network is of mesh type, wherein sensors communicate with the central processing unit via mediation of neighboring sensors or via intermediate communication units as in cellular telephony. In the emergency mode, the sensor abandons its receive function and sends rare and short messages that identify its position. These messages, when received by the nearest normally powered and fully functional sensor, are related to the CPU by the residual mesh network still in place. This information enables the CPU to establish both topological and geographical boundaries of the failure region. Another preferred embodiment of the communication network is high-frequency communication between sensors that belong to the same cluster, i.e. installed on a common conductor.

Topologically, the sensor of the invention includes two Ports. A connecting line is associated with one of these Ports leading to the nearest Node. The other connecting line is associated with a remote Node. In the preferred embodiment, the sensor internal structure is symmetric with respect to both ports. For the purpose of sensor orientation, the port leading to the nearest Node can be identified, e.g. by color. This orientation is an essential characteristic of the sensor. This is because the sensor measures the direction of the energy flow or the instantaneous direction of current with respect to the above-mentioned orientation. Furthermore, the phase wires of the connecting line Ports should be matched with respect to those of the Node. This enables the sensor to identify the instantaneous voltage polarity. The color marking will enable the installer to orient the sensor in a recognizable way.

In order to assure the safety of users, the individual sensors should not have galvanic contacts with any of the phase wires of the connecting line.

Figure 4:
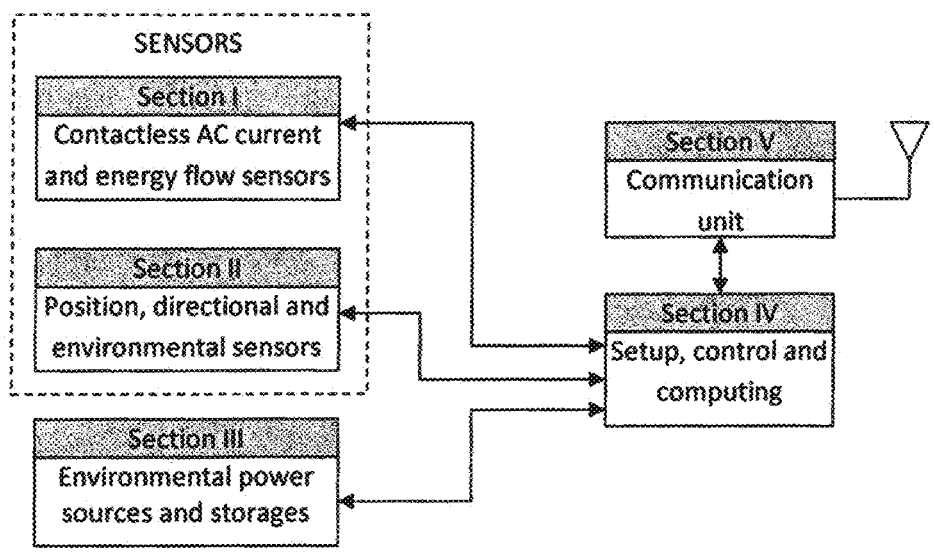
FIG. 4 illustrates a general structure of the sensor of the invention

We are referring now to FIG. 4 showing the internal implementation of the primary sensor of the invention. It is illustrated in this figure that, the first section (Section I) is the main contactless element sensitive to AC current magnitude. The current sensor can be implemented as a current transformer, a "Rogowski coil", a Hall effect sensor, or some other magneto-sensitive (e.g. magneto-resistive or magneto-optical) element. The essential function of this sensor is to measure the magnitude of AC current in the primary wire without direct electrical coupling. Section I also comprises directional detector of energy flow. This detector is preferably based on the measurement of the direction of the Poynting vector associated with the energy flow in the connecting line.

Section II comprises sensors of position and spatial orientation of the sensor body. It may also include environmental sensors, gauging such variables as temperature, sunlight and humidity. Altogether, there may be three different kinds of sensors in Section II.

Position sensor (GPS, GLONASS or similar one) provides the geographical position of the sensor. Such position can be used to generate a unique network address of the sensor and serves the needs for automatic sensor map generation.

Directional sensor (e.g. electronic compass or radio compass) is activated after installation and upon measuring the spatial orientation of the sensor body in the ground plane relative to a standard local axis.

Environmental sensors are collecting information about important parameters affecting the power consumption activity, relative to the intensity of sunlight, the temperature and the humidity. Furthermore, additional environmental sensors may be deployed identifying the wind speed and direction, the atmospheric pressure, etc.

Section III comprises environmental power sources and energy storage elements. This section is responsible for power collecting and storage. Many conventional environmental sources of energy can be implemented separately or in combination. Among these sources of energy are: solar cell, windmill generator, current transformer, etc.

Current transformer is preferably combined with the current sensor of Section I by using two secondary coils on the same magnetic core.

In one of the embodiments, the energy storage function is implemented as a combination of rechargeable batteries with super capacitors. To ensure the best utilization efficiency of environmental energy the power distribution from different sources to storage devices is controlled by a storage algorithm. Initially, this algorithm automatically directs the electrical charge energy into the super capacitor. Only after the capacitor is fully charged, the energy is re-directed into the rechargeable battery.

Section IV is the computing unit. It is the main control unit of the sensor. Installation and control parameters are stored in this unit as well. The unit controls activation of all sensors in a programmable manner. It also keeps the setup information and includes the geographical position, the orientation and the status of the sensor. Software of the control unit includes system and operational parts.

The System part contains non-erasable data and provides the main communication and power control functions. It also controls data exchange with the communication network.

The Operational part (loadable) controls the sensors, the data storage and the processing operations. This part can be updated from time to time over the wireless network.

A control unit is provided to run both in the power-saving mode and the full-power mode. Such modes are selected by the internal power meter (decision based on level of storage and generated energy). Another preferred way to control the consumed energy is through the use of a multi-core processor with selectively activated memory blocks.

An important function of the main control unit is the power failure detection. When the consumed power is below a pre-selected threshold, the sensor switches into the "power failure beacon" mode. In this mode, the sensor minimizes all internal loads and sends an alarm message, which includes the sensor identification.

Section V is the main communication unit, formed with a protection (encryption) arrangement and it provides two modes of communications. The first mode is short distance/ high speed adapted for service personnel; whereas the second mode is long distance/low data rate provided for main operation.

The short distance mode supports one of the popular communication standards (Bluetooth, Zigbee, Wi-Fi, etc.). In this mode, the service personnel is provided with fast data reading and fast software updates.

The long-distance mode is contemplated for emergency operation. In particular, it ensures that the point of power failure will be rapidly located. In the "power failure beacon" mode, each sensor relays data so long as it has access to power. This means that the CPU will be able to identify essentially only those points of power failure that are near the still normally functioning parts of the sensor mesh network. In the case of a massive failure, this information is sufficient for the CPU to establish the topological and geographical boundaries of the disaster region.

With respect to operation, the central processing unit (CPU) interrogates all sensors on the network, receives the data from each sensor, constructs the Graph and evaluates the state of the network. In the preferred embodiment, the communication unit of the CPU is located near one of the power source nodes, also referred as the central node. The Graph is then constructed sequentially, starting from the central node and branching out in the direction of remote loads, maintaining the averaged Kirchhoff law for the RMS current at each node and taking into account the geographical position of the nodes. Position of each node in the Graph is determined by the geographical position of the associated sensors.

The monitoring system of the invention provides the technical capability for apprehension of unwelcome leaks of the power, associated, for example, with unlawful tapping of the grid by an unrecognized party. Any tampering with the network which results in unaccounted current flow will generate a violation of the above discussed set of equations, and should be seen by the CPU with a pinpointed location. In a fully implemented version of the grid monitoring system, with sensors installed at all lines down to every user, the presence of an illegally tapped line will be seen automatically, since said illegally tapped line will have no associated sensor. The leaked power will therefore not be reported by the sensor network and the state of the power network will exhibit a violation of Kirchhoff's law. This will provide a nearly instantaneous automatic detection of the unlawful leak.

In the case of an incomplete network, tampering with the power distribution at a level below the monitored level can be uncovered by comparing the total energy incoming into the last monitored node over a specified period with the sum of energies received by all legitimate customers from that node. A significant discrepancy will trigger investigation. This discovery, however, would not be instant nor automatic and this consideration may be a compelling incentive for the power grid owner to complete the sensor network down to every customer.

Figure 5:
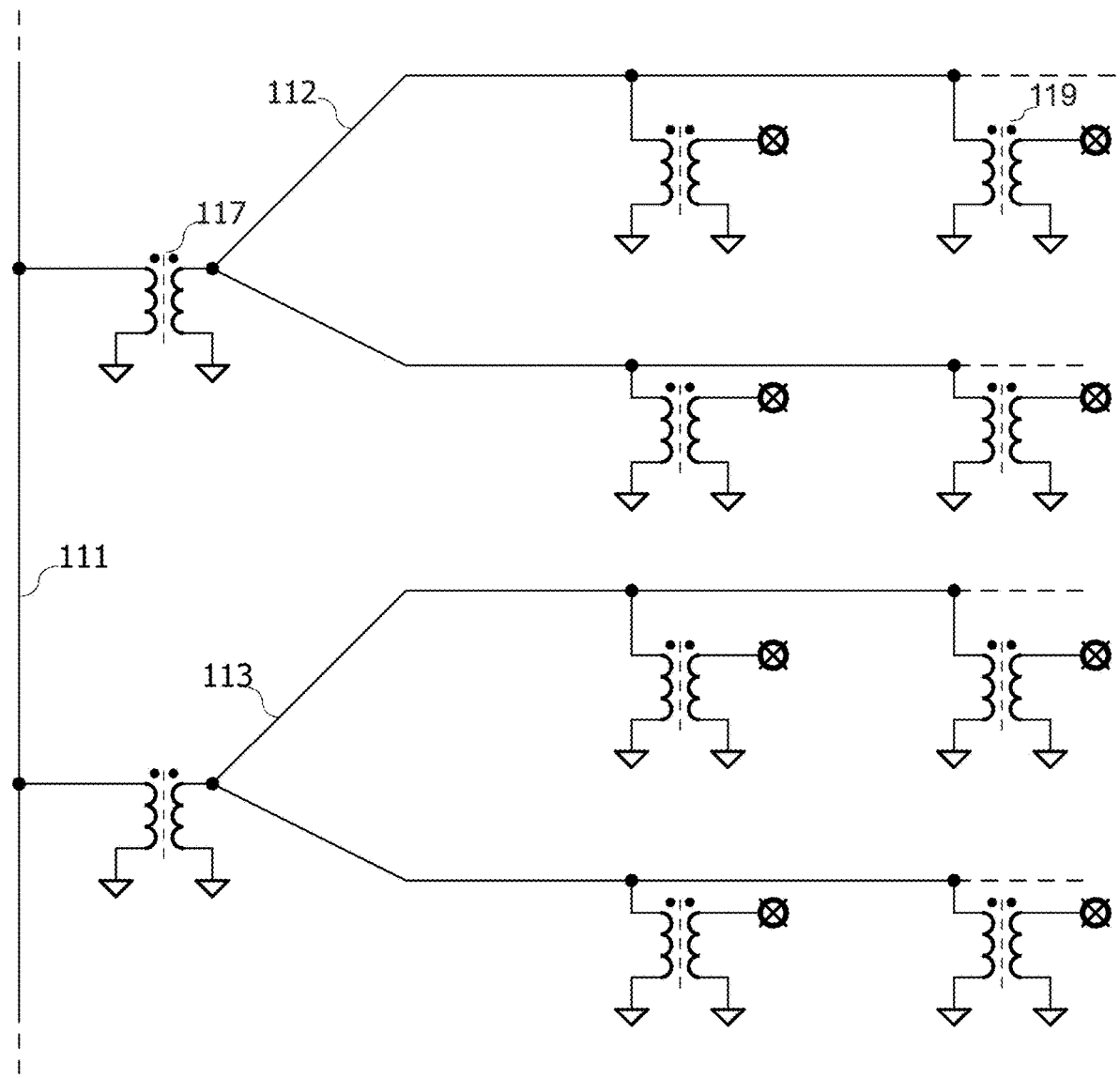
FIG. 5 is a diagram representing a single-phase power distribution network as a set of conductors.
Figure 6:
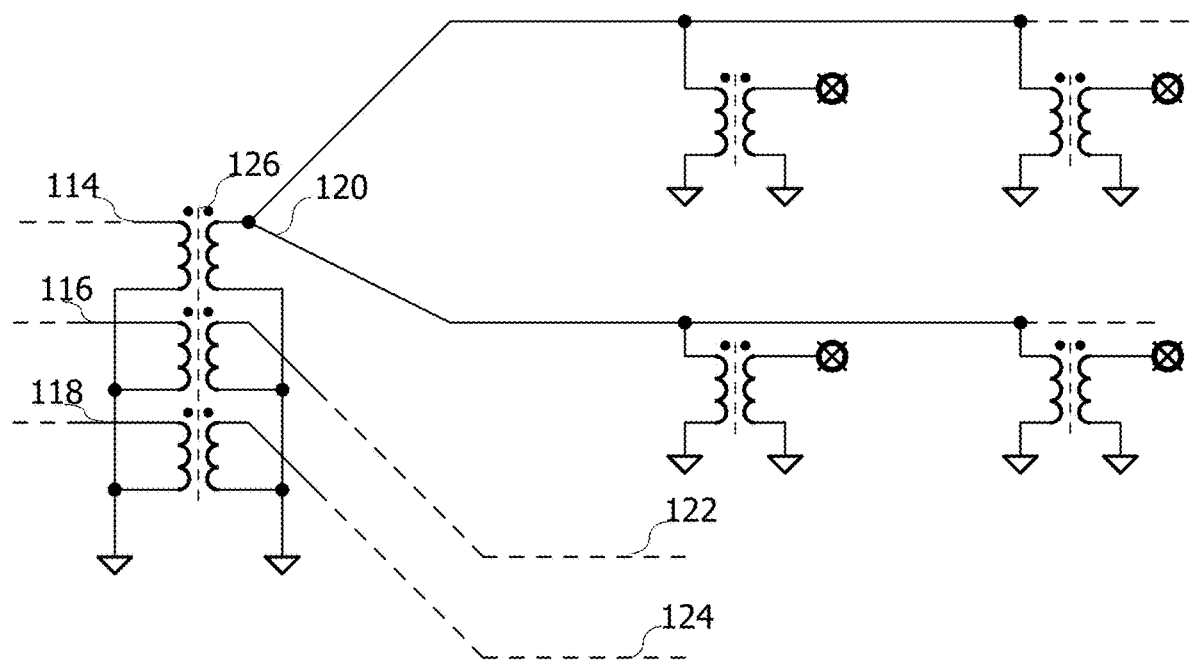
FIG. 6 is a diagram representing a three-phase power distribution network as a set of conductors.

Data collection from the residential network monitoring system may be simplified by separating the sensors into clusters. The clusters may be naturally formed by joining sensors that are installed on the same conductor and capable of communicating between themselves and the data collection unit over the powerline conductor. The examples of such clusters are shown in FIG. 5 and FIG. 6 of the application. Electrical energy is transferred from upper level to lower level power distribution conductors using transformers. Those transformers are typically not transparent for higher frequency communications signals used for communication. In the present invention, this property is used to employ the transformers as natural separating elements for clusters.

We are referring now to FIG. 5 which is a diagram representing a single-phase power distribution network as a set of conductors. The power distribution network includes a plurality of conductors connected to each other via transformers 117. In the single-phase network, the set of conductors, delivering power to individual customers, are connected via transformer to the upper-level conductor, which delivers power from the substation. The individual customers are also receiving power via transformers. As a result, all the conductors in the network are terminated with transformers. In FIG. 5 conductor 111 belongs to the upper level of the network, whereas conductor 112 and conductor 113 are used for delivery of power to customers.

The clusters in FIG. 5 are formed by a series of step-down transformers 117, that convert high voltage of the upper layer of the network (conductor 111) to lower voltage for residential power distribution (conductor 112 and conductor 113). Each lower level branch represents a continuous conductor (conductor 112 and conductor 113) and all the sensors installed on the conductor will form a separate cluster. Each conductor branch is terminated with a step-down transformer 119, which reduces the voltage further before it could be supplied to the consumers. The additional branches (not shown) that are formed by conductors following the transformers give rise to additional clusters. The sensors installed on the upper level network conductor (conductor 111) also form a separate cluster. The inner coil of each terminal transformer, that is the one connected to the clusters (belonging to conductor 112 and conductor 113), is shorted (in high-frequency only) by a capacitor that provides a path to ground for high-frequency communication signals between sensors belonging to the same cluster.

Reference is made now to FIG. 6, which is a diagram representing three-phase power distribution network as a set of conductors. Each phase is delivered by a separate conductor, which is separated from other conductors by inductance of the transformer. The conductors used for delivery of power to individual customers are separated from upper-level conductors by three-phase step-down transformer. The group formed by conductor 114, conductor 116 and conductor 118 is used for upper-level three-phase power delivery. Conductor 120, conductor 122 and conductor 124 are used for distribution of power to individual customers.

In the network configuration shown in FIG. 6, the three-phase upper level network branch is terminated with the three-phase step-down transformer 126. Each phase conductor of the branch (conductor 114, conductor 116 and conductor 118) is forming a separate cluster of sensors. The step-down transformer output represents three conductors (conductor 120, conductor 122 and conductor 124), each conductor forming its own branch for residential power distribution. Sensors installed on each of those three conductors also represent a separate cluster.

Figure 7:
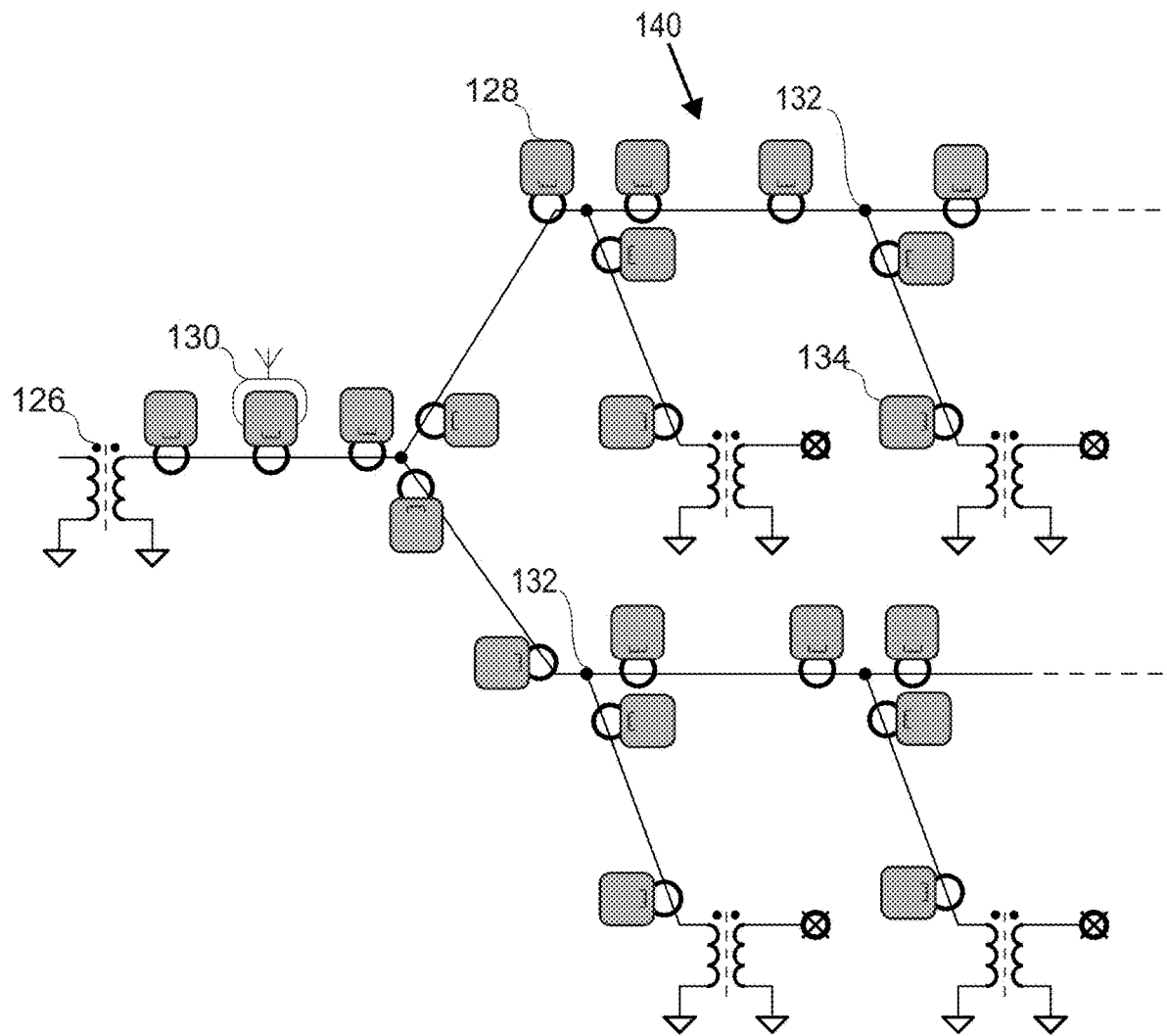
FIG. 7 Is a diagram illustrating a cluster of sensors installed on one conductor.

FIG. 7 illustrates an arrangement, wherein sensors installed on one conductor and communicating over this conductor are joined into one cluster. FIG. 7 represents the structure of a typical cluster 140. The conductor is separated from the other conductors by transformers 126, that attenuate the high frequency signals used for communication. Each cluster contains a Communication Unit 130, installed on the same conductor. The sensors 128 (represented as squares) are attached to each conductor around each branching point 132 and near each terminating point 134. All the sensors that belong to the same conductor are capable of sending signals to and receiving signals from the Communication Unit 130, and are assigned to the same cluster. Sensors are incapable of communicating across transformers: each sensor communicates only with one Communication Unit 130 installed on the same conductor, and therefore assigned to only one cluster.

Figure 8:
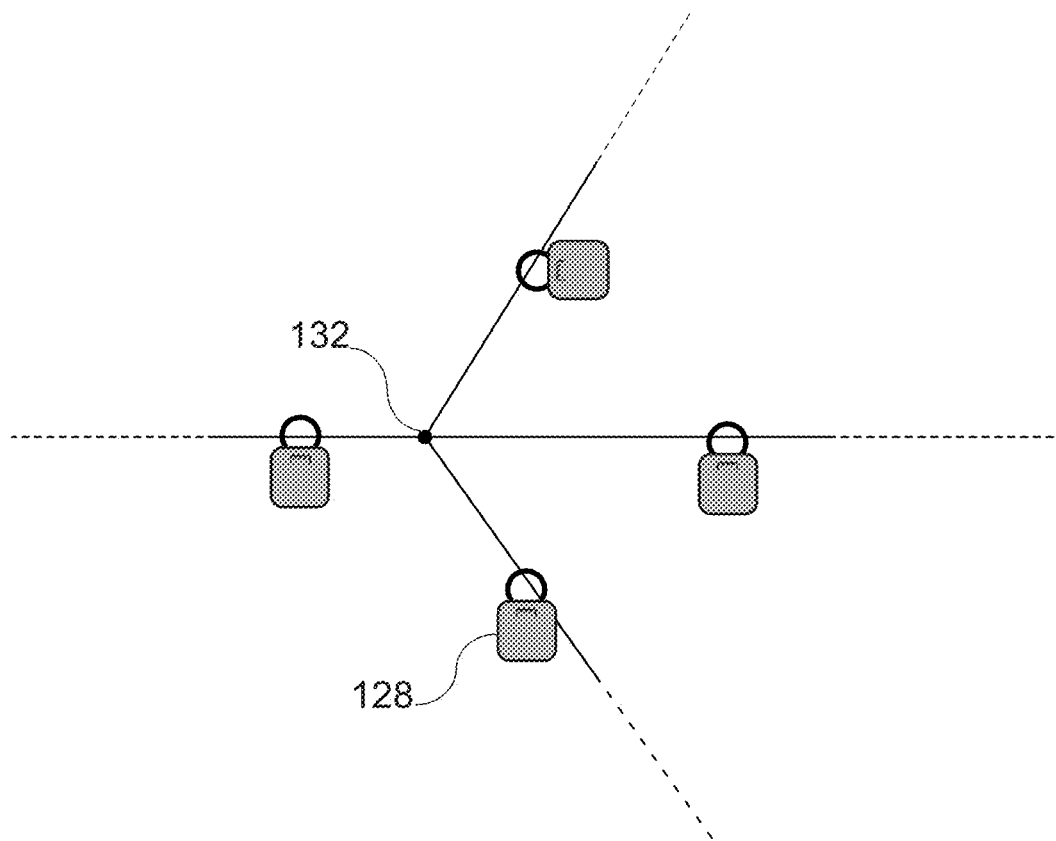
FIG. 8 Is a diagram depicting multiple sensors installed at inputs and outputs of the branching nodes of the conductor.

FIG. 8 illustrates placement of sensors 128 around branching point 132. More specifically, sensors are installed at inputs and outputs of the branching nodes of the conductor. Each sensor is clamped around the conductor and may periodically collect the following data at the point of installation: RMS of electrical current in the conductor; phase of current; phase of voltage; direction of energy flow in the conductor (the direction of Poynting vector); GPS coordinates of the point of installation. The acquisition of data is performed periodically. Time of data acquisition can be synchronized with high precision over the network of sensors by using the GPS time, available in each sensor, avoiding the potentially challenging task of organizing global synchronization of sensors. The internal sensor clock, synchronized using GPS time, is used to measure phases of current and voltage in the conductor. The sensors that belong to the same cluster communicate by sending modulated electrical signals over the conductor. The sensors automatically group into clusters by identifying the conductor, over which they communicate. The sensors may communicate over the conductor only with the sensors that belong to the same cluster.

Figure 9:
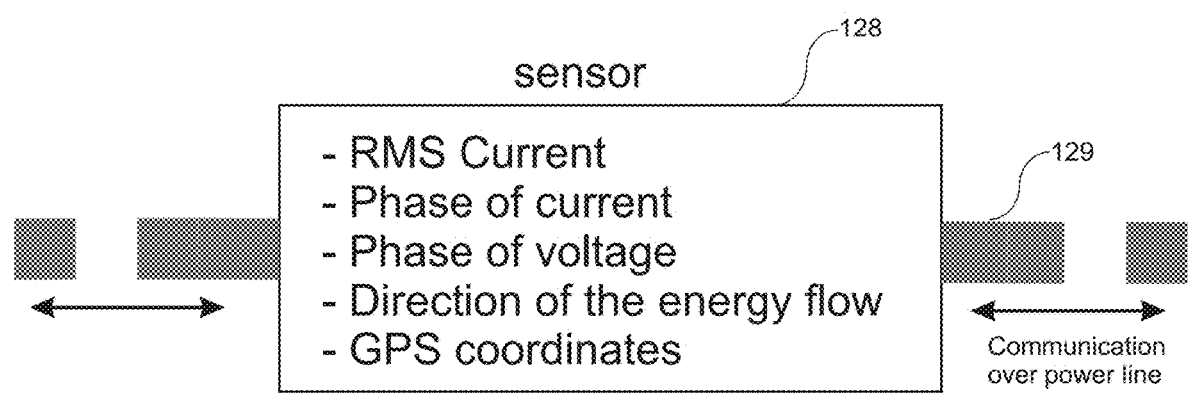
FIG. 9 is a schematic diagram representing that each sensor is measuring and transmitting certain information to the Communication Unit.

As depicted in FIG. 9, each sensor 128 is measuring and transmitting to the Communication Unit the following information: RMS value of current in the conductor, phase of current in the conductor, phase of voltage in the conductor, direction of energy flow in the conductor (Poynting vector), GPS coordinates of the sensor. Sensors communicate with the Communication Unit over powerline 129.

Figure 10:
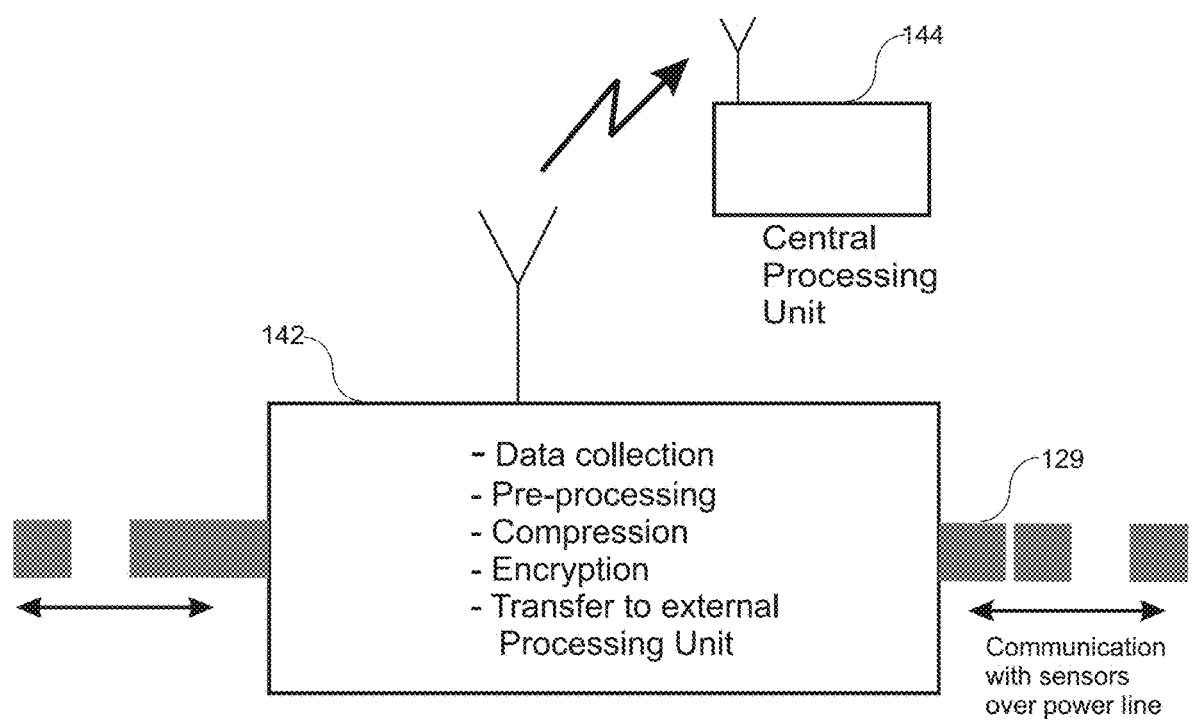
FIG. 10 Is a diagram illustrating the Communication Unit performing multiple functions.

As illustrated in FIG. 10, each cluster 140 contains at least one Data Collection and Transfer Unit 142, equipped with an arrangement for communication to external Central Processing Unit 144. The Data Collection and Transfer Unit 142 may be part of one of the sensors that belong to the cluster, or represent a separate unit installed on the same conductor and responsible only for data collection and transfer functions. In addition, the unit may perform data preprocessing, that includes data resampling, compression and encryption functionalities. Thus, the unit is prepared for efficient and secure transmission to the Central Processing Unit. The Data Collection and Transfer Unit communicates with the sensors that belong to the cluster over the electrical conductor and with the external Central Processing Unit by using any convenient communication method, including Ethernet, Wi-Fi and cellular wireless network.

The data collected by the network of sensors of the invention simultaneously serves several purposes, including generation and validation of the power distribution network map, monitoring integrity of electrical connections and real-time analysis of the power generation and consumption in the network. This invention discloses application of the sensor network to automated generation of power distribution network maps, but the same data may be used for performing other type of the network analysis. The approach to automated map generation is described in relation to only one cluster. The maps of individual clusters are described in a computer file that may be advantageously stored within that cluster's Data Collection and Transfer Unit endowed with pre-processing functions. These maps may be combined to obtain the map of larger sections of the power distribution network or the whole network.

Sensors are separated into clusters automatically at the time of installation. The Data Collection and Transfer Unit 142 is installed on the powerline conductor 129 first and its unique number identifies the cluster. After installation on a powerline conductor, each sensor attempts to communicate with Data Collection and Transfer Unit. A sensor is assigned to the same cluster as the Data Collection and Transfer Unit, capable of successfully communicating with the sensor. If a sensor is unable to communicate with the Data Collection and Transfer Unit at the time of installation, it performs periodic attempts to establish the connection. If the Data Collection and Transfer Unit is installed on a conductor, which already has several installed sensors, the same procedure of assignment of sensors to cluster is performed after installation of the Data Collection and Transfer Unit.

Sensors are performing periodic synchronous measurements of RMS value, phases of current and voltage in the conductor, and the direction of the Poynting vector. Synchronization of measurements is achieved by using the GPS time. The results of measurements are then transmitted by the sensors over the powerline conductor to the Data Collection and Transfer Unit. The data is transmitted in the form of packets. The communication throughput may be improved by combining the results of multiple measurements by the sensor in one packet. Since the consecutively acquired data points from the same sensor are likely to be correlated, compression of data may reduce the total amount of transmitted data. Each measurement should be marked by the time stamp that indicates the time of data acquisition. If multiple periodically obtained data points are combined in one packet, only one-time stamp for the first data point may be included in the packet. In this case, time for the remaining data points may be computed from time stamp of the first data point and known period between measurements. The data from all sensors that belong to one cluster are collected by the Data Collection and Transfer Unit, which converts data to the form, suitable for transmission to the Central Processing Unit, and performs data transfer using suitable communication method, such as Ethernet, Wi-Fi and cellular wireless network. The communication method is selected based on the facilities available at the location of the Data Collection and Processing Unit, taking into account cost of installation and data transfer fees. Depending on implementation, the Data Collection and Transfer Unit may also perform data preprocessing, including cluster map generation or validation of the existing cluster map, in order to reduce computational load on the Central Processing Unit.

In the computer description of the cluster map, the connections between the branching points of a conductor, which is carrying the sensors that belong to one cluster, are performed using the data on RMS current synchronously measured by all the sensors in the cluster and GPS coordinates of those sensors. One preferred implementation of the method designates one sensor of the cluster, which is installed on the conductor at the location where it is connected to the output of the step-down transformer, as the 'root' sensor. The computation procedure starts from the 'root' sensor and attempts to find a sensor or a combination of sensors, such that the current or the sum of currents reported by those sensors is equal to the current reported by the 'root' sensor. The currents should be added according to Kirchhoff Current Law (KCL) taking into account synchronously measured phase of each currents. Such sensor or a group of sensors is assumed to be directly connected to the 'root' sensor. To reduce the complexity of computations during search of connected sensors, the geographical area can be limited to the vicinity of the 'root' sensor by using GPS coordinates of the sensors. The same procedure is iteratively repeated for all the sensors, connected to the 'root' sensor, and then continued until connections for all sensors in the cluster are found. Since the accuracy of current measurements is limited, the first generated map may be only an estimate, and the procedure should be repeated multiple times in conditions with different distribution of currents, before accurate network map is generated.

The Communication Unit 130 performs collection of data from all sensors 128 in the cluster 140, preprocessing, compression and encryption of the data and transfer of the data to the external Processing Unit 144. Communication with the external Processing unit 144 may be performed using any standard wired or wireless interface available at the location, such as Ethernet, Wi-Fi or GPRS.

Figure 11:
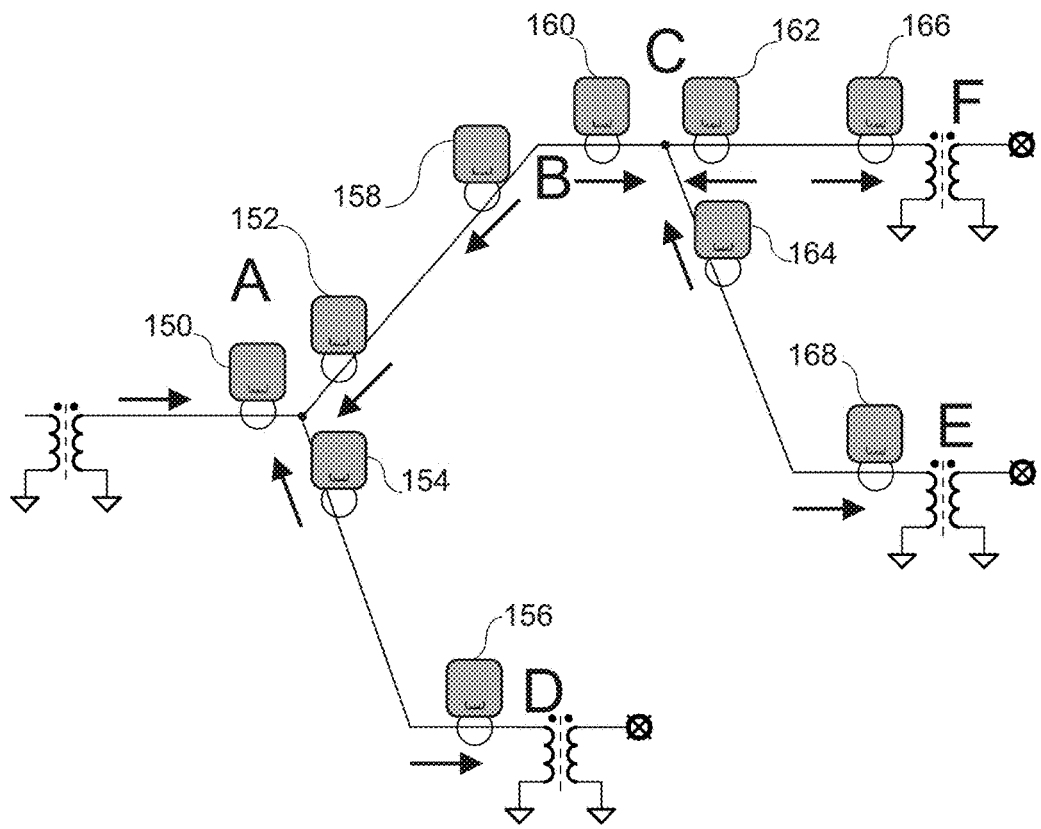
FIG. 11 is a diagram illustrating estimation of cluster topology and generation of cluster map.
Figure 11:
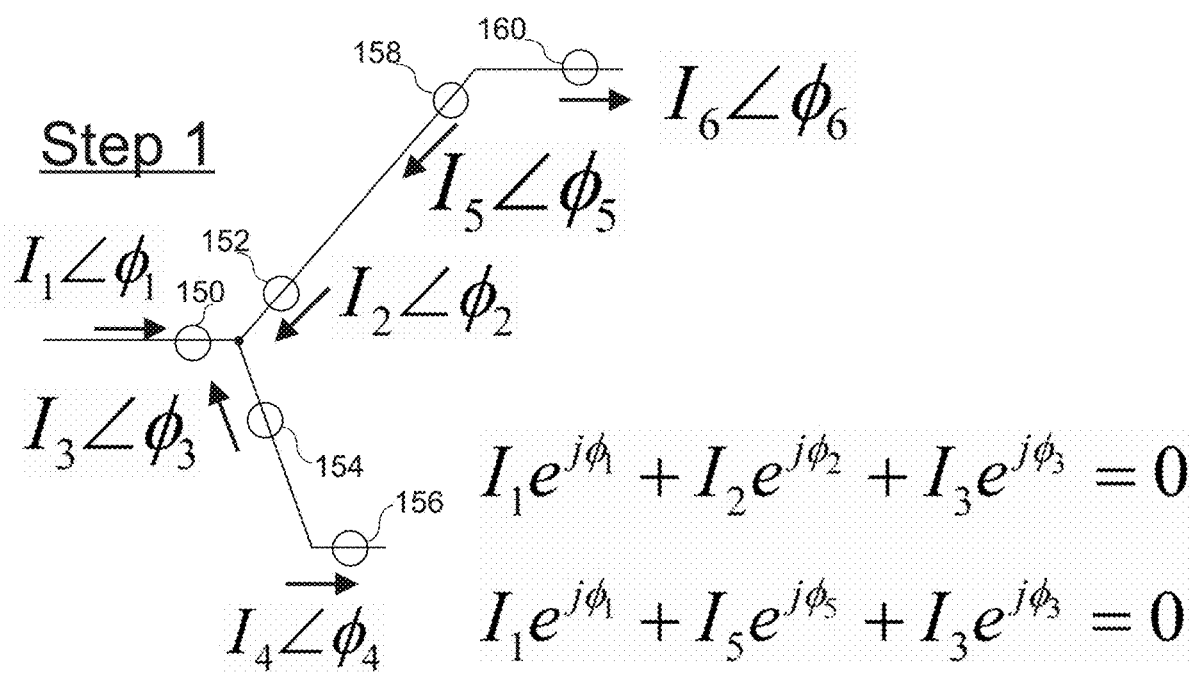

FIG. 11 is a diagram illustrating estimation of cluster topology and generation of cluster map. The sensors are installed according to the following rules: if the sensors are installed at the branching node, the positive direction of current (used in writing the Kirchhoff's Current Law, shown by arrows) points towards the node (sensors 150,152 and 154 at node A; sensors 160,162,164 at node C); if the sensor is installed at the transformer, the positive direction of current points towards the transformer (sensors 156, 166 and 168), unless the sensor is at the branching node (sensor 150); if a sensor installed in the middle of the conductor, the direction of current may be selected arbitrarily (sensor 158). Sensor 150 is located at the point of connection to upper-level conductor of the network and designated as the 'root' sensor of the cluster.

The computation procedure is illustrated using simple, but non-trivial network, shown in FIG. 11. The network includes 6 nodes, identified from A to F, and contains 10 sensors, numbered from 150 to 168. The arrows next to sensors show sensor orientation, which is used when writing KCL equations. The sensors are always installed according to the following rules: sensors placed at the split node are pointing towards the node; sensors at the load are pointing towards the load, unless those sensors are at the split node; single sensors installed on a wire could be arbitrarily oriented. The topology estimation starts from Sensor 150, which is placed at the 'root' of the network.

FIG. 12 represents the table which contains an example of data, collected from the sensors of the network. An example of numerical information, obtained from the sensors is shown in FIG. 12 The information consists of the sensor number (sensor ID), magnitude and phase of current and coordinates of the sensor (GPS coordinates). For this simulation, the table was generated by selecting arbitrary current magnitude and phase values at each load, and then computing the remaining currents using the diagram of FIG. 11.

Initially, the topology estimation algorithm does not have information on connection within the network or which sensors are placed at the loads. Available data includes the location of 'root' sensor, the values of currents measured by all sensor and the coordinates of all sensors. In the following discussion, we will denote the magnitude of current measured by the i-th sensor as $I_i$, phase of the current as $\phi_i$ and the coordinates as $(x_i, y_i)$. The topology estimation algorithm will execute the following steps:

1. As to the initial step, the system starts at the 'root' Sensor #150, and attempts to find a set of sensors that includes Sensor 150, such that KCL is satisfied. In the following example, we will write the magnitude and phase of the currents in the phasor format: $I_i \angle \phi_i$, where $I_i$ represents the magnitude of current $\phi_i$ and represents the phase of current measured by i-th sensor. The current measured by Sensor #150 can be found from the table of FIG. 12 as 43.2064∠4.8275°. The algorithm explores two possibilities. Sensor #150 can be installed at the transformer and connected to the next sensor by the conductor without splitting. In this case, the next sensor will measure the same current, but, since its orientation is unknown, the phase may be shifted by 180°. The algorithm is checking the table to see whether there is any other sensor that reported current 43.2064∠4.8275° or 180° shifted current 43.2064∠−175.1725°. Quick verification of the table of FIG. 12 shows that there is no such sensor. Then the algorithm explores the second possibility, that the sensor is installed at the split node. Since the sensors on the split node are always oriented towards, the node, the following KCL equation must hold:

$$I_1 e^{j\phi_1} + \sum_i I_i e^{j\phi_i} = 0.$$

Expanding exponential as $e^{j\phi_i} = \cos \phi_i + j \sin \phi_i$ yields $$I_1 \cos\phi_1 = -\sum_i I_i \cos\phi_i$$

$$I_1 \sin\phi_1 = -\sum_i I_i \sin\phi_i.$$

By trying combinations of currents from the table, it could be found that the following combinations of sensors satisfy the above equations:
Combination 1: Sensor #152 and Sensor #154
Combination 2: Sensor #158 and Sensor #154
In order to decide, which combination to select, the algorithm is computing the sum of distances from Sensor #150 to all the sensors in the combination. The distance to sensors in Combination 1:

$$D_1 = d_{12} + d_{13}$$

$$d_{ij} = \sqrt{(x_i - x_j)^2 + (y_i - y_j)^2}$$

and the distance to sensors in Combination 2:

$$D_2 = d_{15} + d_{13}.$$

Substituting numerical values yields $D_1 = 4.47$ and $D_2 = 6.71$. The Combination 1 that comprises sensors with closest geographical location is selected. It is recorded that Sensors #150, #152 and #154 are located at the split node. The algorithm marks those sensors as already connected, and does not use them in further search.

2. As to a next step, a search is conducted for the combination of connected sensors containing Sensor #154. The search is also performed in two stages. First, a single sensor, that reported the same current as Sensor #154 15∠−160° or the current 15∠20°, which is shifted by 180°. The search of the table of currents shows, that Sensor #156 reported the current 15∠20°, which means that those sensors are installed on the same conductor, but oriented in opposite direction. Sensor #156 is marked as connected.

3. As to a further step, a search is carried out for possible connections for Sensor #156 returns negative result, so Sensor #156 is marked as located at the node.

4. Still another step includes a search for the connections for Sensor #152 is performed. Sensor #152 reported the current 28.9963∠177.0461°. The table is searched for the identical current, or the current 28.9963∠−2.9539°, which is shifted by 180°. Searching through the table, the algorithm finds two possible connections: Sensor #158 returning identical current, and Sensor #160 returning the current shifted by 180°. The closest sensor is selected. The distance between Sensor #152 and Sensor #158 $d_{25} = 2.24$ and the distance between Sensor #152 and Sensor #160 is $d_{26} = 3.61$. The Sensor #158 is selected as the closest and is marked as already connected.

5. In a further step, a search for the connections for Sensor #158 is performed. Searching the table shows, that Sensor #160 returned the same current as Sensor #158, but shifted by 180°. Since there is no other matching, the connection between Sensor #158 and Sensor #160 is recorded and Sensor #160 is marked as already connected.

6. As to this step, a search for the connections for Sensor #160 is performed. The search for sensors that reported identical or 180°-shifted current fails. Then the option, that the Sensor #160 is placed at the split node is explored. The search returned that for currents reported by Sensor #162 and Sensor #164 the KCL holds. Since there is no other combinations, it is recorded that Sensors #160, #162 and #164 are located at the split node. The sensors are marked as already connected.

7. In this step, similar to the above, Sensor #166 returns the same, but 180°-shifted current as Sensor #162, so the connection between those sensors is recorded.

8. In the ultimate step, Sensor #168 returns the same, but 180°-shifted current as Sensor #164, so the connection between those sensors is recorded.

As a result, the graph of connections between all the sensors is created. Plotting the graph of connections on geographical map will give the map of the cluster.

What is claimed is:

1. A system comprising:
   a. a plurality of sensors;
   b. a branched conductor of an AC power line, functionally associated with said plurality of sensors in a galvanic-contact free manner, said branched conductor forming a communication medium between different ones of said plurality of sensors, such that communication between different ones of said plurality of sensors, via said branched conductor, is carried out at frequencies higher than a frequency of said AC power line,
      wherein at least one sensor of said plurality of sensors is disposed at the end of each branched conductor, at each branching point of said branched conductor, and
      wherein each of said plurality of sensors is adapted to carry out measurements of root mean square current passing through each said branch of said branched conductor and of an orientation of a Poynting vector in said branch, said measurements being synchronous between all of said plurality of sensors; and
   c. a central processing unit adapted to receive data related to said synchronous measurements conducted by said plurality of sensors, and to analyze said received data so as to ascertain a graph topology of said branched conductor and a distribution of said root mean square current passing through each said branch of said graph.

2. The system of claim 1, wherein each of said plurality of sensors further comprises a GPS receiver.

3. The system of claim 2, wherein a GPS signal received by each of said GPS receivers, is utilized to synchronize said measurements of said root mean square current passing through each said branch of said branched conductor and a direction of energy flow in said branch.

4. The system of claim 2, wherein a GPS signal received by each said GPS receiver is utilized to identify a geographical position of a corresponding one of said plurality of sensors.

5. The system of claim 2, wherein a GPS signal received by each said GPS receiver is utilized to identify an elevation of a corresponding one of said plurality of sensors.

6. The system of claim 4, wherein said central processing unit is further adapted to geographically map said graph topology of said branched conductor.

7. The system of claim 1, wherein all of said plurality of sensors repeatedly carry out synchronous measurements of said root mean square current.

8. The system of claim 1, further comprising at least one external communication element capable of using alternative channels of communication beyond said branched conductor.

9. The system of claim 1, further comprising at least one data collection and transfer unit, functionally associated with at least some of said plurality of sensors and with said central processing unit, said at least one data collection and transfer unit adapted to repeatedly cluster data related to said synchronous measurements conducted by said at least some of said plurality of sensors, said data being repeatedly received from said at least some of said plurality of sensors, and to repeatedly transmit clustered data related to said synchronous measurements to said central processing unit.

10. The system of claim 9, wherein each said branch of said branched conductor includes one of said at least one data collection and transfer unit, adapted to cluster data related to said synchronous measurements conducted by ones of said plurality of sensors in said branch.

11. The system of claim 10, wherein:
each specific data collection and transfer unit in each specific branch of said branched conductor is adapted to analyze said clustered data received from ones of said plurality of sensors in said specific branch, to ascertain a graph topology of said specific branch of said branched conductor, and to transmit said graph topology of said specific branch to said central processing unit; and
said central processing unit is adapted to combine graph topologies of specific branches, received from data collection and transfer units in those specific branches, to ascertain said graph topology of said branched conductor.

12. A method of monitoring the state of an electric power grid including a branched conductor of an AC power line having a plurality of sensors disposed thereon, wherein at least one sensor of said plurality of sensor is disposed, in a galvanic-contact free manner, at the end of each branched conductor, at branching point of said branched conductor, said electric power grid further including a central processing unit functionally associated with said plurality of sensors, the method comprising:
enabling communication, between different ones of said plurality of sensors, via said branched conductor, at frequencies higher than a frequency of said AC power line;
at said plurality of sensors, repeatedly synchronously measuring a root mean square current passing through each said branch of said branched conductor and of an orientation of a Poynting vector in said branch;
repeatedly receiving, at said central processing unit, data related to synchronous measurements; and
at said central processing unit, analyzing said received data to ascertain a graph topology of said branched conductor and a distribution of said root mean square current passing through each said branch of said graph.

13. The method of claim 12, wherein each of said plurality of sensors further comprises a GPS receiver, and wherein said method further comprises:
at each said GPS receiver, receiving at least one GPS signal.

14. The method of claim 13, further comprising, using said GPS signals, synchronizing said measurements of said root mean square current passing through each said branch of said branched conductor and a direction of energy flow in said branch.

15. The method of claim 13, further comprising, using each said GPS signal received by each said GPS receiver, identifying a geographical position of each of said plurality of sensors.

16. The method of claim 13, further comprising, using each said GPS signal received by each said GPS receiver, identifying an elevation of each of said plurality of sensors.

17. The method of claim 15, further comprising, at said central processing unit, based on said geographical positions of said plurality of sensors, geographically mapping said graph topology of said branched conductor.

18. The method of claim 12, wherein the electric power grid further includes at least one data collection and transfer unit, wherein said repeatedly receiving data related to said synchronous measurements comprises:
repeatedly clustering, at said at least one data collection and transfer unit, data related to said synchronous measurements conducted by at least some of said plurality of sensors functionally associated with said at least one data collection and transfer unit, said data received by communication via said branched conductor; and
repeatedly transmitting, using a second communication channel, clustered data related to said synchronous measurements from said at least one data collection and transfer unit to said central processing unit,
wherein said second communication channel is different from communication via said branched conductor.

19. The method of claim 18, wherein each said branch of said branched conductor includes one of said at least one data collection and transfer unit, and wherein said repeatedly clustering comprises repeatedly receiving, at each said data collection and transfer unit, data related to said synchronous measurements conducted by ones of said plurality of sensors in said branch.

20. The method of claim 19, wherein:
said repeatedly clustering, by each specific data collection and transfer unit in each specific branch of said branched conductor, further comprises:
analyzing data received from ones of said plurality of sensors in said specific branch; and
ascertaining a graph topology of said specific branch of said branched conductor;
said transmitting said clustered data comprises transmitting said graph topology of said specific branch to said central processing unit; and
said analyzing at said central processing unit comprises combining graph topologies of specific branches, received from data collection and transfer units in those specific branches, to ascertain said graph topology of said branched conductor.

* * * * *